(12) United States Patent
Otsuka et al.

(10) Patent No.: US 12,047,206 B2
(45) Date of Patent: Jul. 23, 2024

(54) DIFFERENTIAL TRANSMISSION CIRCUIT

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Shigeki Otsuka, Nisshin (JP); Hyoungjun Na, Nisshin (JP); Takasuke Ito, Nisshin (JP); Yoshikazu Furuta, Nisshin (JP); Tomohiro Nezuka, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 128 days.

(21) Appl. No.: 17/868,057

(22) Filed: Jul. 19, 2022

(65) Prior Publication Data
US 2023/0062515 A1    Mar. 2, 2023

(30) Foreign Application Priority Data
Aug. 25, 2021 (JP) .................. 2021-137146

(51) Int. Cl.
*H04L 25/02*       (2006.01)
*H03K 17/687*     (2006.01)

(52) U.S. Cl.
CPC ..... *H04L 25/0272* (2013.01); *H03K 17/6872* (2013.01); *H04L 25/028* (2013.01)

(58) Field of Classification Search
CPC .............. H04L 25/0272; H04L 25/028; H04L 25/0276; H03K 17/6872; H03K 2217/0054
See application file for complete search history.

(56) References Cited

U.S. PATENT DOCUMENTS

| | | | |
|---|---|---|---|
| 6,766,395 B1 | 7/2004 | Tinsley et al. | |
| 2006/0170451 A1 | 8/2006 | Jordanger et al. | |
| 2007/0152749 A1* | 7/2007 | Liu ........................ | H03K 5/01 330/129 |
| 2007/0263749 A1* | 11/2007 | Teng .................. | H04L 25/0272 375/312 |
| 2009/0052559 A1* | 2/2009 | Iwasaki ................ | H04L 25/029 375/257 |
| 2012/0083224 A1* | 4/2012 | Visser ................... | H04B 1/525 455/83 |
| 2021/0013884 A1* | 1/2021 | Yano ...................... | H04L 25/02 |

\* cited by examiner

*Primary Examiner* — Sibin Chen
(74) *Attorney, Agent, or Firm* — Posz Law Group, PLC

(57) ABSTRACT

A differential transmission circuit for a communication device performs bidirectional communication via a differential transmission line. The differential transmission circuit include: output transistors that are turned on and off according to a drive signal during a transmission period; a signal generation unit that generates and outputs the drive signal; short-circuit transistors connected between gates and drains of the output transistors; and a cut off unit that cuts off a supply path of the drive signal between the signal generation unit and the gates of the output transistors. The cut off unit cuts off the supply path of the drive signal during a reception period in which a reception operation is performed by the communication device.

7 Claims, 11 Drawing Sheets

DIFFERENTIAL TRANSMISSION CIRCUIT

CROSS REFERENCE TO RELATED APPLICATIONS

The present application claims the benefit of priority from Japanese Patent Application No. 2021-137146 filed on Aug. 25, 2021. The entire disclosure of the above application is incorporated herein by reference.

TECHNICL FIELD

The present disclosure relates to a differential transmission circuit used in a communication device that performs bidirectional communication via a differential transmission line.

BACKGROUND

Conventionally, CAN, a multipoint LVDS standard, that is, M-LVDS and the like are known as communication standards in a communication device that performs bidirectional communication via a differential transmission line. CAN is a registered trademark and is an abbreviation for Controller Area Network. LVDS is an abbreviation for Low Voltage Differential Signaling. In these communication standards, common mode noise resistance is improved for in-vehicle applications in which communication devices are mounted on vehicles, industrial equipment in which communication devices are applied to industrial equipment, and the like.

SUMMARY

According to an example, a differential transmission circuit for a communication device may perform bidirectional communication via a differential transmission line. The differential transmission circuit may include: output transistors that are turned on and off according to a drive signal during a transmission period; a signal generation unit that generates and outputs the drive signal; short-circuit transistors connected between gates and drains of the output transistors; and a cut off unit that cuts off a supply path of the drive signal between the signal generation unit and the gates of the output transistors. The cut off unit may cut off the supply path of the drive signal during a reception period in which a reception operation is performed by the communication device.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
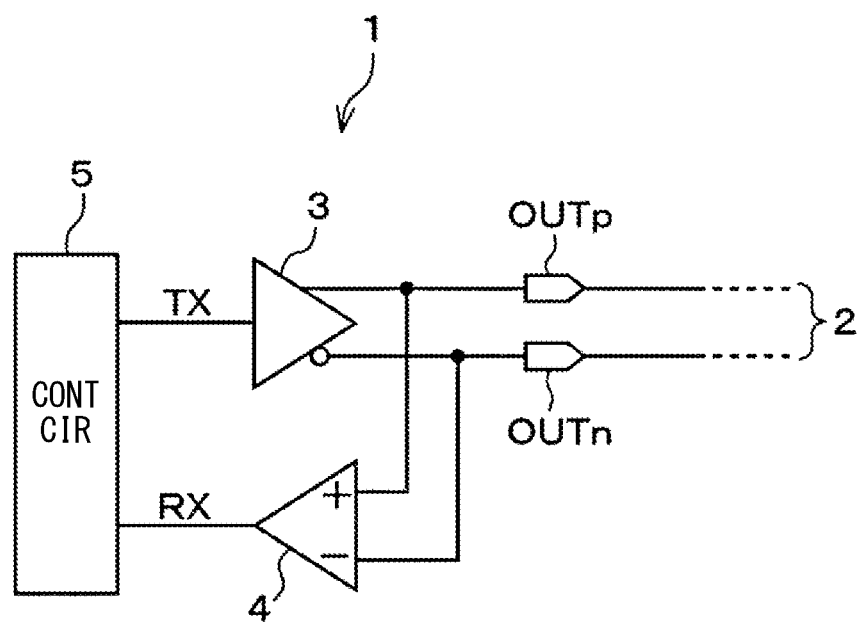
FIG. 1 is a diagram schematically showing a configuration of a communication device according to a first embodiment.

In a differential receiver circuit according to a conceivable technique, which is the reception circuit used in a communication device, the influence of common mode noise is reduced by increasing the input impedance and interposing an attenuator between the input terminal and the internal circuit. In this case, the output terminal of the differential transmission circuit, which is the transmission circuit used in the above-mentioned communication device, is shared with the input terminal of the differential reception circuit. Therefore, in the above-mentioned communication device, the differential transmission circuit is turned off during the reception period when the reception operation is performed, the input signal is clamped so that a large current does not flow even if the common mode noise below the ground level of the circuit or above the power supply voltage of the circuit is input, so that the dynamic range of the input of the differential reception circuit is not restricted. In this specification, the ground may be abbreviated as GND.

A conceivable technique 1 teaches a circuit configuration example of a CAN differential transmission circuit. Hereinafter, the circuit configuration example of the differential transmission circuit provided in the conceivable technique 1 will be referred to as a first conceivable configuration. In the first conceivable configuration, by inserting a diode in series with the output signal path, the common terminal with the differential reception circuit is not clamped even if the common mode noise below the GND level or above the power supply voltage is input.

A conceivable technique 2 teaches a circuit configuration example of a differential transmission circuit of M-LVDS. Hereinafter, the circuit configuration example of the differential transmission circuit provided in conceivable technique 2 will be referred to as a second conceivable configuration. In the second conceivable configuration, a pass gate is added to the output of the differential circuit, and the back gate of the transistor of the pass gate is switched according to the input voltage level to increase the clamp level as a level of clamping when a common mode voltage below the GND level is input.

In the first conceivable configuration, since a voltage drop corresponding to two diodes occurs during the transmission period in which the transmission operation is performed, there may arise a difficulty of narrowing the dynamic range of the output of the differential transmission circuit. Further, in the second conceivable configuration, the current when clamped flows out through the output transistor having a small on-resistance just by switching the bias, so that a large current may flow.

The present embodiments has been made in view of the above circumstances, and the present embodiments provide a differential transmission circuit capable of increasing the clamp level during the reception period without narrowing the dynamic range of the output.

The differential transmission circuit may be used in a communication device that performs bidirectional communication via a differential transmission path, and include: a plurality of output transistors, each of which is a MOSFET that is turned on and off according to a drive signal during a transmission period in which a transmission operation is performed by the communication device; a signal generation unit that generates and outputs the drive signal; a plurality of short-circuit transistors, each of which is a MOSFET connected between a gate and a drain of one of the plurality of output transistors; and a cutoff unit that cuts off a supply path of the drive signal between the signal generation unit and a gate of each output transistor.

In the above configuration, the cutoff unit cuts off the drive signal supply path during the reception period in which the reception operation is performed by the communication device. As a result, the gate of the output transistor becomes high impedance. Further, at this time, even if a common mode noise below a GND level of the circuit or above the power supply voltage of the circuit is input from the differential transmission line, the short-circuit transistor is turned on before the output transistor is turned on due to the influence thereof. As a result, the gate and the drain of the output transistor are short-circuited, so that the timing at which the output transistor is turned on due to the influence of common mode noise is delayed.

As described above, according to the above configuration, the clamp level during the reception period can be increased. Further, in the above configuration, since the diode as in the first conventional technique is not provided, no voltage drop occurs in the transmission period and the output signal path. Therefore, according to the above configuration, it is possible to obtain an excellent effect that the clamp level in the reception period can be expanded without narrowing the dynamic range of the output.

The differential transmission circuit may have a first resistor connected between the back gate and the source of the output transistor, and a first switch connected between the terminals of the first resistor. In the above configuration, the first switch is turned on during the transmission period. As a result, in the above configuration, the back gate and the source of the output transistor are short-circuited during the transmission period, and the first resistor does not affect the switching operation of the output transistor during the transmission operation, and the normal transmission operation is performed.

Further, in the above configuration, the first switch is turned off during the reception period. As a result, in the above configuration, the back gate of the output transistor is biased via the first resistor during the reception period. In the above configuration, as described above, when the common mode noise below the GND level of the circuit or above the power supply voltage of the circuit is input from the differential transmission line during the reception period, the short-circuit transistor is turned on first, and then the output transistor is turned on. After that, a current flows through the parasitic diode existing between the back gate and the drain of the output transistor, but in the above configuration, the current is limited because the first resistance is added to the path through which the current flows. Thereby, according to the above configuration, the clamp level during the reception period can be further expanded.

Hereinafter, embodiments of the present disclosure are described with reference to the drawings. In the following embodiments, substantially identical elements have the same numerals, and description of the identical elements will not be repeated.

First Embodiment

The following describes a first embodiment with reference to FIGS. 1 to 5.

The communication device 1 of the present embodiment shown in FIG. 1 may be applied to, for example, in-vehicle use, industrial equipment, and the like. The communication device 1 is configured as a semiconductor integrated circuit, that is, an IC, and performs bidirectional communication with another communication device (not shown) via the differential transmission line 2. The communication device 1 includes a differential transmission circuit 3, a differential reception circuit 4, and a control circuit 5. Further, the communication device 1 includes a terminal OUTp and a terminal OUTn connected to the differential transmission line 2.

The differential transmission circuit 3 transmits data corresponding to the transmission signal TX output from the control circuit 5 to another communication device via the terminals OUTp, OUTn and the differential transmission line 2. The differential reception circuit 4 receives data transmitted from another communication device via the differential transmission line 2 and the terminals OUTp and OUTn, and outputs the reception signal RX to the control circuit 5. As described above, the communication device 1 has a configuration in which the output terminal of the differential transmission circuit 3 and the input terminal of the differential reception circuit 4 are common. The control circuit 5 generates a transmission signal TX and outputs the transmission signal TX to the differential transmission circuit 3. Further, the control circuit 5 inputs a reception signal RX output from the differential reception circuit 4, and executes a predetermined process based on the input reception signal RX.

Figure 2:
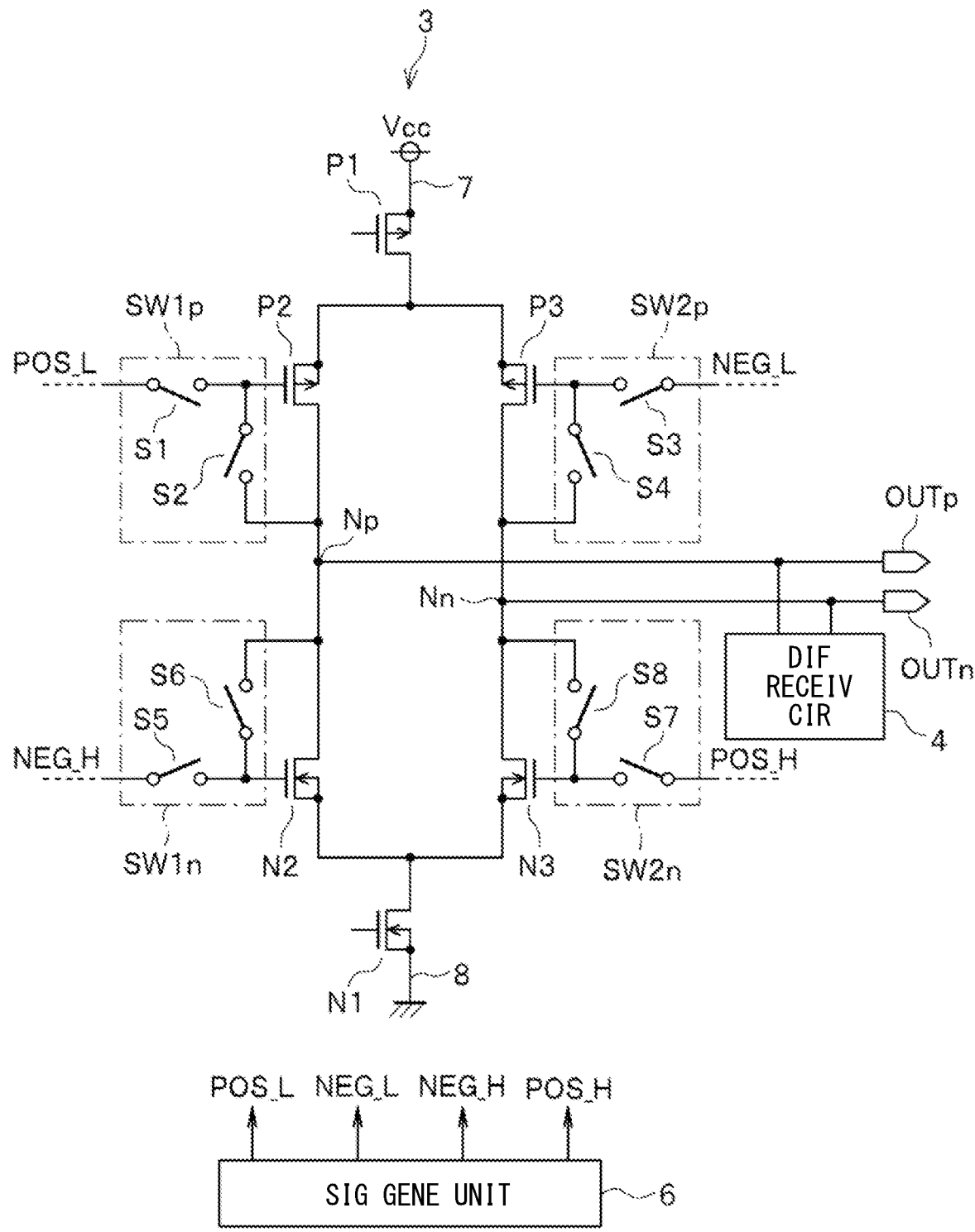
FIG. 2 is a diagram showing a specific configuration example of the differential transmission circuit according to the first embodiment.

As a specific configuration of the differential transmission circuit 3 used in the communication device 1, for example, the configuration shown in FIG. 2 may be adopted. The differential transmission circuit 3 includes transistors P1, P2, P3 which are P-channel MOSFETs, transistors N1, N2, N3 which are N-channel MOSFETs, switch circuits SW1*p*, SW1*n*, SW2*p*, SW2*n*, a signal generation unit 6, and the like. The signal generation unit 6 generates and outputs drive signals POS_L, NEG_L, NEG_H, and POS_H, which are binary signals, based on the transmission signal TX given from the control circuit 5.

In this case, the drive signals POS_L, NEG_L, NEG_H, and POS_H are at levels corresponding to the transmission signal TX during the transmission period in which the transmission operation is performed by the communication device 1. Further, in this case, the drive signals POS_L and NEG_L are at high levels and the drive signals NEG_H and POS_H are at low levels during the reception period in which the reception operation is performed by the communication device 1. In this case, the low level is GND and the high level is the power supply voltage Vcc. In the following description, the low level may be referred to as an L level, and the high level may be referred to as an H level.

The source of the transistor P1 is connected to the power supply line 7. A power supply voltage Vcc of a circuit such as 5 V or 3.3 V is given to the power supply line 7. The transistor P1 constitutes a constant current source through which a constant current flows together with other circuit elements (not shown) connected to the gate. The transistors P2 and P3 are differential pair transistors, and their respective sources are connected to the drain of the transistor P1.

The back gates of the transistors P2 and P3 are directly connected to their respective sources. The drain of the transistor P2 is connected to the node Np connected to the terminal OUTp. The drain of the transistor P3 is connected to the node Nn connected to the terminal OUTn. The transistors P1 and P2 are turned on and off according to the drive signals POS_L and NEG_L during the transmission period, and function as output transistors.

The switch circuit SW1p includes switches S1 and S2. The switch S1 is connected between the output terminal of the drive signal POS_L of the signal generation unit 6 and the gate of the transistor P2. The switch S2 is connected between the gate and the drain of the transistor P2. Although the details will be described later, the switches S1 and S2 are turned on during the transmission period and turned off during the reception period.

In the above configuration, the switch S1 can cut off the supply path of the drive signal POS_L from the signal generation unit 6 to the gate of the transistor P2, and functions as a cutoff unit. As described above, the switch S1 is turned off during the reception period, whereby the supply path of the drive signal POS_L is cut off.

The switch circuit SW2p includes switches S3 and S4. The switch S3 is connected between the output terminal of the drive signal NEG_L of the signal generation unit 6 and the gate of the transistor P3. The switch S4 is connected between the gate and the drain of the transistor P3. Although the details will be described later, the switches S3 and S4 are turned on during the transmission period and turned off during the reception period.

In the above configuration, the switch S3 can cut off the supply path of the drive signal NEG_L from the signal generation unit 6 to the gate of the transistor P3, and functions as a cutoff unit. As described above, the switch S3 is turned off during the reception period, whereby the supply path of the drive signal NEG_L is cut off.

The source of the transistor N1 is connected to the ground line 8. The ground line 8 is given a reference potential of the circuit, that is, a GND of 0 V. The transistor N1 constitutes a constant current source through which a constant current flows together with other circuit elements (not shown) connected to the gate. The transistors N2 and N3 are differential pair transistors, and their respective sources are connected to the drain of the transistor N1.

The back gates of the transistors N2 and N3 are directly connected to their respective sources. The drain of the transistor N2 is connected to the node Np. The drain of the transistor N3 is connected to the node Nn. The transistors N1 and N2 are turned on and off according to the drive signals NEG_H and POS_H during the transmission period, and function as output transistors.

The switch circuit SW1n includes switches S5 and S6. The switch S5 is connected between the output terminal of the drive signal NEG_H of the signal generation unit 6 and the gate of the transistor N2. The switch S6 is connected between the gate and the drain of the transistor N2. Although the details will be described later, the switches S5 and S6 are turned on during the transmission period and turned off during the reception period.

In the above configuration, the switch S5 can cut off the supply path of the drive signal NEG_H from the signal generation unit 6 to the gate of the transistor N2, and functions as a cutoff unit. As described above, the switch S5 is turned off during the reception period, whereby the supply path of the drive signal NEG_H is cut off.

The switch circuit SW2n includes switches S7 and S8. The switch S7 is connected between the output terminal of the drive signal POS_H of the signal generation unit 6 and the gate of the transistor N3. The switch S8 is connected between the gate and the drain of the transistor N3. Although the details will be described later, the switches S7 and S8 are turned on during the transmission period and turned off during the reception period.

In the above configuration, the switch S7 can cut off the supply path of the drive signal POS_H from the signal generation unit 6 to the gate of the transistor N3 and functions as a cutoff unit. As described above, the switch S7 is turned off during the reception period, whereby the supply path of the drive signal POS_H is cut off.

Figure 3:
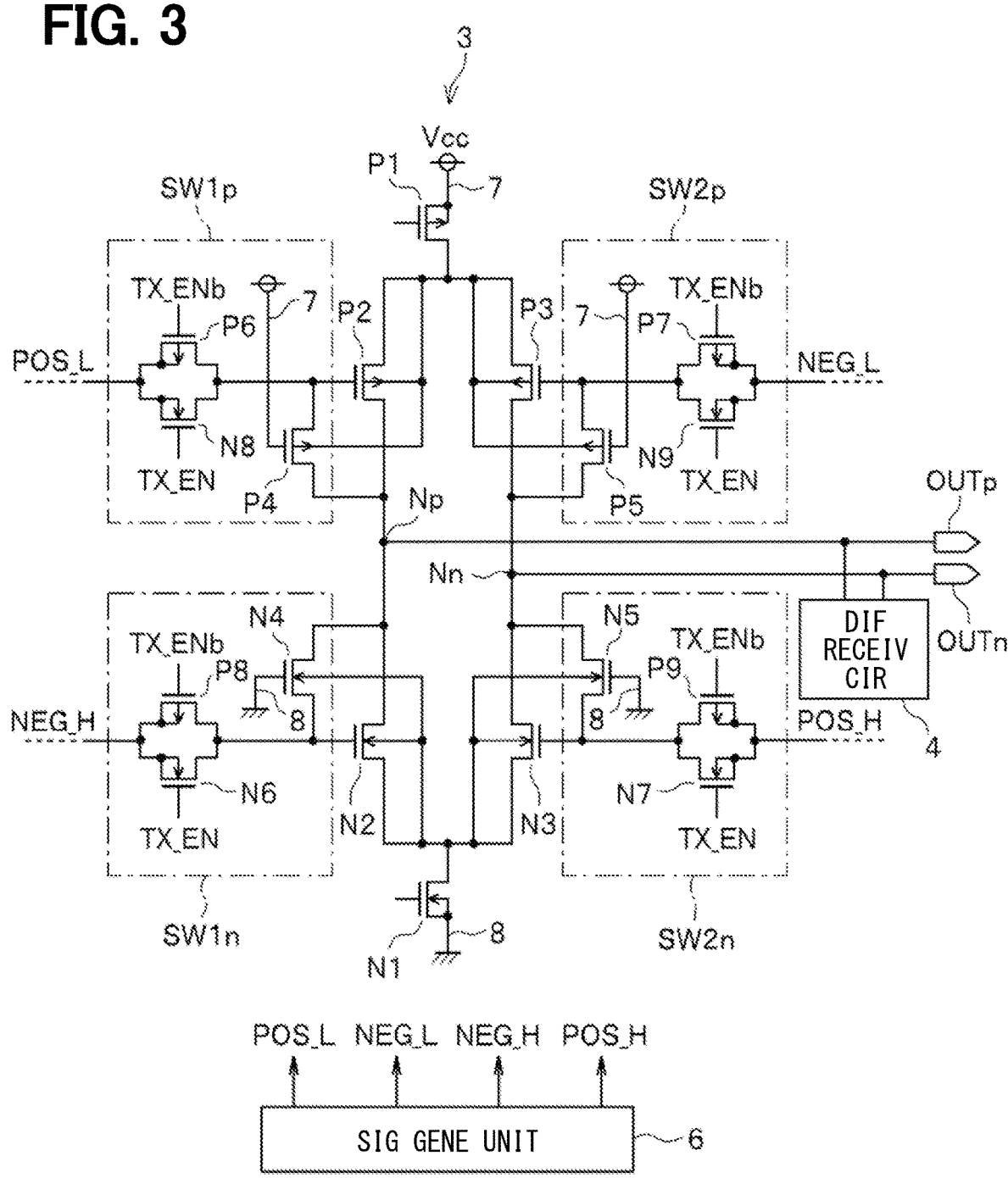
FIG. 3 is a diagram showing a specific configuration example of a differential transmission circuit that embodies the configuration of the switch circuit according to the first embodiment.

As a specific configuration of the switch circuits SW1p, SW2p, SW1n, and SW2n described above, for example, the configuration shown in FIG. 3 may be adopted. The switch circuit SW1p includes transistors P4 and P6 which are P-channel MOSFETs and a transistor N8 which is a N-channel MOSFET. Each source of the transistors P6 and N8 is connected in common and is connected to the output terminal of the drive signal POS_L of the signal generation unit 6. Further, the drains of the transistors P6 and N8 are connected in common and are connected to the gate of the transistor P2.

A signal TX_ENb is given to the gate of the transistor P6. A signal TX_EN is given to the gate of the transistor N8. The signal TX_ENb is a binary signal having an L level during the transmission period and an H level during the reception period. Further, the signal TX_EN is a binary signal having an H level during the transmission period and an L level during the reception period. As described above, the transistors P6 and N8 are configured as analog switches provided so as to intervene in series with the supply path of the drive signal POS_L. In this case, the switch S1 is configured by an analog switch including transistors P6 and N8.

The source of the transistor P4 is connected to the gate of the transistor P2, and its drain is connected to the drain of the transistor P2. The back gate of the transistor P4 is connected to the back gate of the transistor P2. The gate of the transistor P4 is connected to the power supply line 7. As described above, the transistor P4 is connected between the gate and the drain of the transistor P2, and functions as a short-circuit transistor. In this case, the switch S2 is configured by the transistor P4. As the transistor P4, an element whose size is smaller than that of the transistor P2 may be adopted.

The switch circuit SW2p includes transistors P5 and P7 which are P-channel MOSFETs and a transistor N9 which is a N-channel MOSFET. Each source of the transistors P7 and N9 is connected in common and is connected to the output terminal of the drive signal NEG_L of the signal generation unit 6. Further, the drains of the transistors P7 and N9 are connected in common and are connected to the gate of the transistor P3.

A signal TX_ENb is given to the gate of the transistor P7. A signal TX_EN is given to the gate of the transistor N9. As described above, the transistors P7 and N9 are configured as analog switches provided so as to intervene in series with the supply path of the drive signal NEG_L. In this case, the switch S3 is configured by an analog switch including transistors P7 and N9.

The source of the transistor P5 is connected to the gate of the transistor P3, and its drain is connected to the drain of the transistor P3. The back gate of the transistor P5 is connected to the back gate of the transistor P3. The gate of the transistor P5 is connected to the power supply line 7. As described above, the transistor P5 is connected between the gate and the drain of the transistor P3, and functions as a short-circuit transistor. In this case, the switch S4 is configured by the transistor P5. As the transistor P5, an element whose size is smaller than that of the transistor P3 may be adopted.

The switch circuit SW1n includes transistors N4 and N6 which are N-channel MOSFETs and a transistor P8 which is a P-channel MOSFET. Each source of the transistors N6 and P8 is connected in common and is connected to the output terminal of the drive signal NEG_H of the signal generation unit 6. Further, the drains of the transistors N6 and P8 are connected in common and are connected to the gate of the transistor N2.

A signal TX_EN is given to the gate of the transistor N6. A signal TX_ENb is given to the gate of the transistor P8. As described above, the transistors N6 and P8 are configured as analog switches provided so as to intervene in series with the supply path of the drive signal NEG_H. In this case, the switch S5 is configured by an analog switch including transistors N6 and P8.

The source of the transistor N4 is connected to the gate of the transistor N2, and its drain is connected to the drain of the transistor N2. The back gate of the transistor N4 is connected to the back gate of the transistor N2. The gate of the transistor N4 is connected to the ground line 8. As described above, the transistor N4 is connected between the gate and the drain of the transistor N2, and functions as a short-circuit transistor. In this case, the switch S6 is configured by the transistor N4. As the transistor N4, an element whose size is smaller than that of the transistor N2 may be adopted.

The switch circuit SW2n includes transistors N5 and N7 which are N-channel MOSFETs and a transistor P9 which is a P-channel MOSFET. Each source of the transistors N7 and P9 is connected in common and is connected to the output terminal of the drive signal POS_H of the signal generation unit 6. Further, the drains of the transistors N7 and P9 are connected in common and are connected to the gate of the transistor N3.

A signal TX_EN is given to the gate of the transistor N7. A signal TX_ENb is given to the gate of the transistor P9. As described above, the transistors N7 and P9 are configured as analog switches provided so as to intervene in series with the supply path of the drive signal POS_H. In this case, the switch S7 is configured by an analog switch including transistors N7 and P9.

The source of the transistor N5 is connected to the gate of the transistor N3, and its drain is connected to the drain of the transistor N3. The back gate of the transistor N45 is connected to the back gate of the transistor N3. The gate of the transistor N5 is connected to the ground line 8. As described above, the transistor N5 is connected between the gate and the drain of the transistor N3, and functions as a short-circuit transistor. In this case, the switch S8 is configured by the transistor N5. As the transistor N5, an element whose size is smaller than that of the transistor N3 may be adopted.

The above-described embodiment provides the following effect.

The differential transmission circuit 3 includes a plurality of transistors P2, P3, N2, N3 that are turned on and off according to the drive signals POS_L, NEG_L, NEG_H, and POS_H during the transmission period in which the transmission operation is performed by the communication device 1, the signal generation unit 6 that generates and outputs the drive signals POS_L, NEG_L, NEG_H, POS_H, transistors P4, P5, N4, N5 connected between the gate and the drain of transistors P2, P3, N2, N3, and switches S1, S3, S5, and S7 capable of blocking the supply paths of the drive signals POS_L, NEG_L, NEG_H, and POS_H from the signal generation unit 6 to the gates of the transistors P2, P3, N2, and N3.

In the above configuration, the switches S1, S3, S5, and S7 are turned off during the reception period in which the communication device 1 performs the reception operation, whereby the supply paths of the drive signals POS_L, NEG_L, NEG_H, and POS_H are cut off. As a result, the gates of the transistors P2, P3, N2, and N3 have high impedance during the reception period.

Further, in the above configuration, even if the common mode noise having the GND level or less or the power supply voltage Vcc or more is input from the differential transmission line 2 during the reception period, the transistors P4, P5, N4, N5 are turned on before the transistors P2, P3, N2 and N3 are turned on due to the influence thereof. When the transistors P4, P5, N4, and N5 are turned on in this way, the gates and the drains of the transistors P2, P3, N2, and N3 are short-circuited, so that the timing at which transistors P2, P3, N2, and N3 are turned on can be delayed.

As described above, according to the above configuration, the clamp level during the reception period can be increased. Further, in the above configuration, since the diode as in the first conventional technique is not provided, no voltage drop occurs in the transmission period and the output signal path. Therefore, according to the above embodiment, it is possible to obtain an excellent effect that the clamp level in the reception period can be expanded without narrowing the dynamic range of the output.

The effect obtained by this embodiment will be further clarified by comparing with the comparison example corresponding to the configuration of the conceivable technique. Although not shown, the configuration of the comparison example described here is such that the switch circuits SW1p, SW2p, SW1n, and SW2n are omitted from the differential transmission circuit 3 of the present embodiment. According to this embodiment, the clamp level in the reception period can be increased as compared with the comparison example. Hereinafter, this reason will be described by taking as an example a case where a voltage Vin having the GND level or lower is applied to the terminal OUTp during the reception period.

That is, in the comparison example, since all the transistors are turned off during the reception period, the gate of the transistor N2 is at the GND level. Therefore, in the comparison example, when a voltage Vin with the GND level or less is applied to the terminal OUTp during the reception period and the voltage Vin becomes a voltage of −Vt or less, which is the threshold value of the transistor N2, the voltage equal to or higher than the threshold value is applied between the gate and drain of the transistor N2. Then, the transistor N2 is turned on, and a current flows from the source to the drain. After that, when the voltage Vin further decreases, the parasitic diode between the back gate and the drain of the transistor N2 is turned on, and a current flows from the back gate toward the drain.

Figure 4:
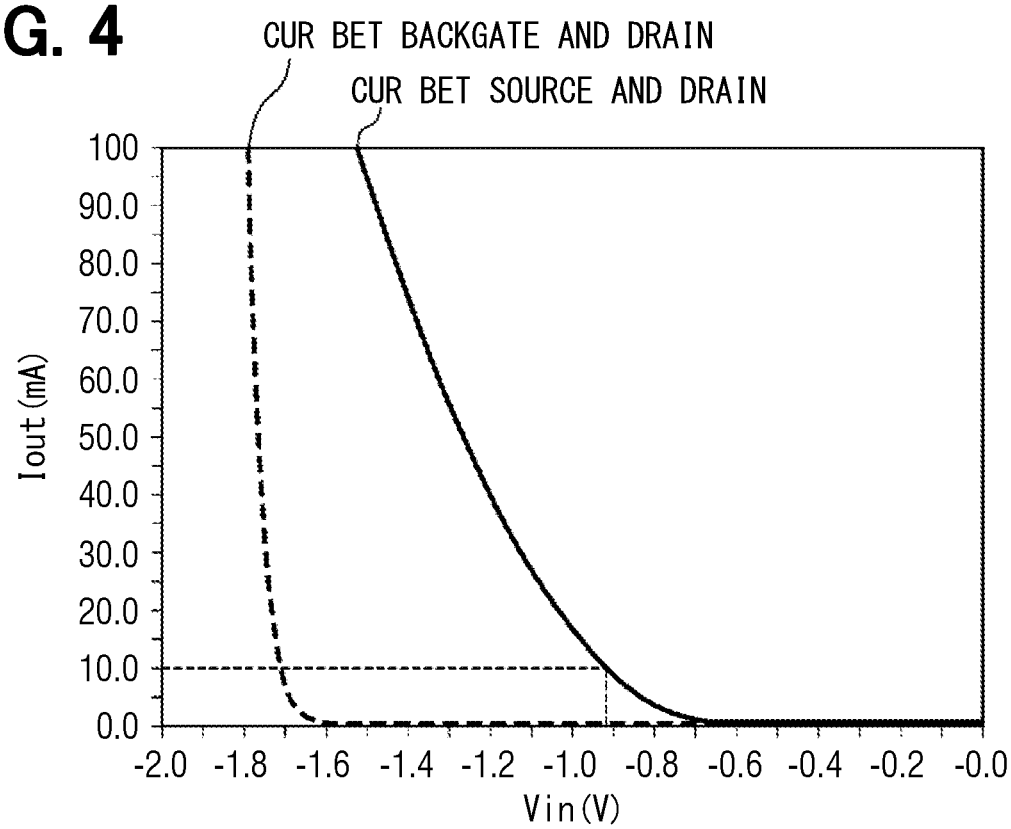
FIG. 4 is a diagram showing an example of the relationship between the terminal voltage and the output current in the reception period according to the comparison example.

As described above, in the configuration of the comparison example, when a voltage Vin having the GND level or lower is applied to the terminal OUTp during the reception period, the current flowing through the transistor N2, that is, the output current Iout is shown in FIG. 4. The horizontal axis in FIG. 4 is the voltage Vin of the terminal OUTp, and the vertical axis thereof is the output current Iout. That is, FIG. 4 shows an example of the relationship between the terminal voltage and the output current during the reception period. Further, the output current Iout in FIG. 4 is shown with the direction in which the current flows from the transistor N2 toward the terminal OUTp as positive.

In FIG. 4, the solid line represents the source-drain current of the transistor N2. The source-drain current of the transistor N2 starts to flow when the voltage Vin reaches about −0.7 V, and becomes about 10.0 mA when the voltage Vin reaches about −0.92 V. Further, in FIG. 4, the broken line represents the current between the back gate and the drain of the transistor N2. The current between the back gate and the drain of the transistor N2 starts to flow when the voltage Vin reaches −1.6 V, and becomes about 10.0 mA when the voltage Vin reaches −1.7 V.

On the other hand, in the present embodiment, since the switch S5, which is an analog switch including the transistors P8 and N6, is turned off during the reception period, the gate of the transistor N2 is set to have high impedance. Therefore, in the present embodiment, even if a voltage Vin with the GND level or less is applied to the terminal OUTp during the reception period and the voltage Vin becomes a voltage of the threshold value or less of the transistor N2, the transistor N2 is not immediately turned on.

However, even if the above feature is performed, the transistor N2 may eventually turn on due to a leak in each circuit element connected to the gate. Here, at this time, when the voltage Vin becomes a voltage equal to or lower than the threshold value of the transistor N4, a voltage equal to or higher than the threshold value is applied between the gate and the drain of the transistor N4. Then, the transistor N4 is turned on before the transistor N2 is turned on, the gate and the drain of the transistor N2 are short-circuited, and as a result, the timing at which the transistor N2 is turned on can be delayed.

Figure 5:
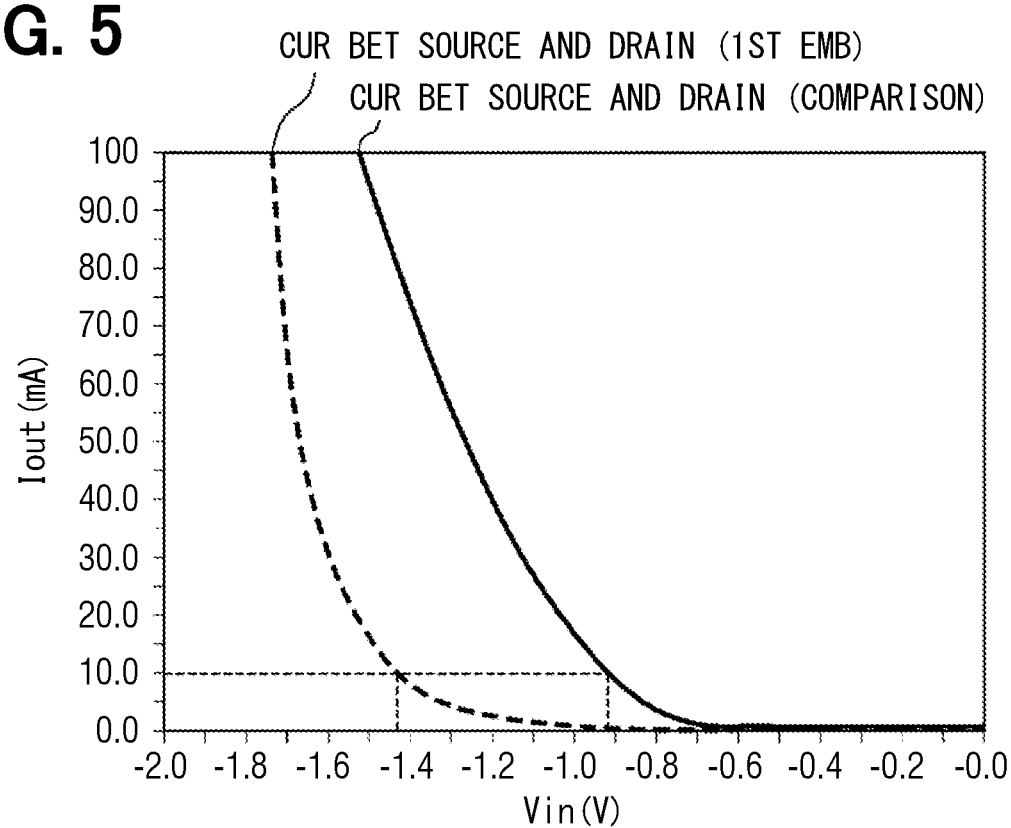
FIG. 5 is a diagram showing an example of the relationship between the terminal voltage and the output current in the reception period according to the first embodiment.

As described above, in the configuration of the present embodiment example, when a voltage Vin having the GND level or lower is applied to the terminal OUTp during the reception period, the current flowing through the transistor N2, that is, the output current Iout is shown in FIG. 5. The horizontal axis in FIG. 5 is the voltage Vin of the terminal OUTp, and the vertical axis thereof is the output current Iout. That is, FIG. 5 shows an example of the relationship between the terminal voltage and the output current during the reception period. Further, the output current Iout in FIG. 5 is shown with the direction in which the current flows from the transistor N2 toward the terminal OUTp as positive, similar to FIG. 4.

In FIG. 5, the broken line represents the source-drain current of the transistor N2 in this embodiment. The solid line in FIG. 5 is for comparison and represents the source-drain current of the transistor N2 in the comparison example. The source-drain current of the transistor N2 according to the present embodiment starts to flow when the voltage Vin reaches about −0.9 V, and becomes about 10.0 mA when the voltage Vin reaches about −1.42 V. That is, according to the present embodiment, when compared with an output current Iout of, for example, 10.0 mA, an increase in the clamp voltage of about 0.5 V, that is, an increase in the clamp level is realized as compared with the comparison example.

In this case, the switches S1, S3, S5, and S7 functioning as a cutoff unit are configured by analog switches provided so as to intervene in series with the supply paths of the drive signals POS_L, NEG_L, NEG_H, and POS_H. According to such a configuration, the gates of the transistors P2, P3, N2, and N3 can be brought into a high impedance state during the reception period by a relatively simple configuration, so that it is possible to restrict the increase of the circuit size due to the addition of the switches S1, S3, S5, and S7 to be minimum.

Second Embodiment

Hereinafter, the second embodiment in which the specific configuration of the differential transmission circuit has been changed with respect to the first embodiment will be described with reference to FIGS. 6 to 8.

Figure 6:
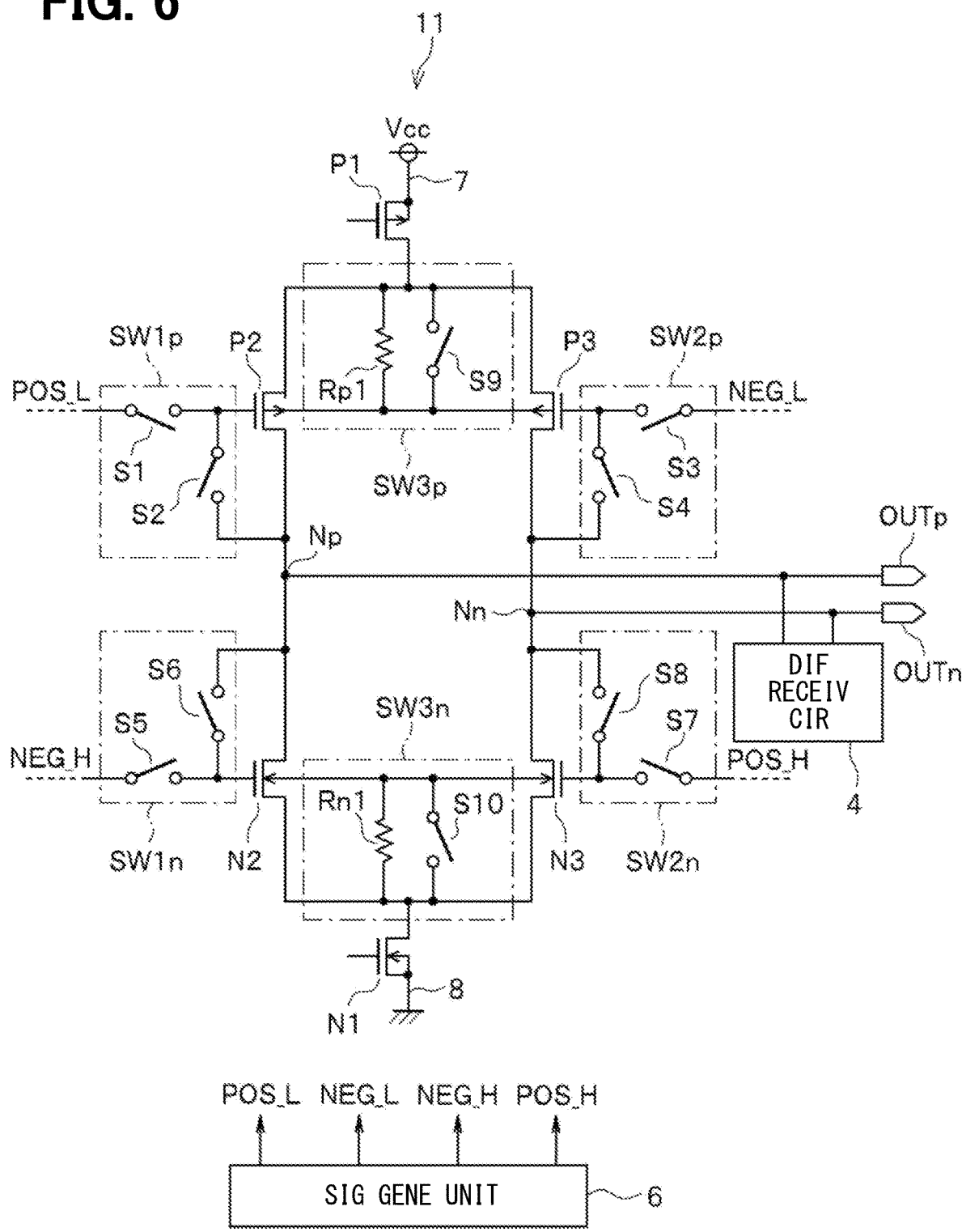
FIG. 6 is a diagram showing a specific configuration example of the differential transmission circuit according to the second embodiment.

As shown in FIG. 6, in the differential transmission circuit 11 of the present embodiment, the switch circuit SW3p and the switch circuit SW3n are added to the differential transmission circuit 3 of the first embodiment shown in FIG. 2, as a different feature.

The switch circuit SW3p includes a resistor Rp1 and a switch S9. The resistor Rp1 is connected between the back gate and the source of the transistor P2 and functions as a first resistor. The switch S9 is connected between the terminals of the resistor Rp1 and functions as a first switch. Although the details will be described later, the switch S9 is turned on during the transmission period and turned off during the reception period.

The switch circuit SW3n includes a resistor Rn1 and a switch S10. The resistor Rn1 is connected between the back gate and the source of the transistor N2 and functions as a first resistor. The switch S10 is connected between the terminals of the resistor Rn1 and functions as a first switch. Although the details will be described later, the switch S10 is turned on during the transmission period and turned off during the reception period.

Figure 7:
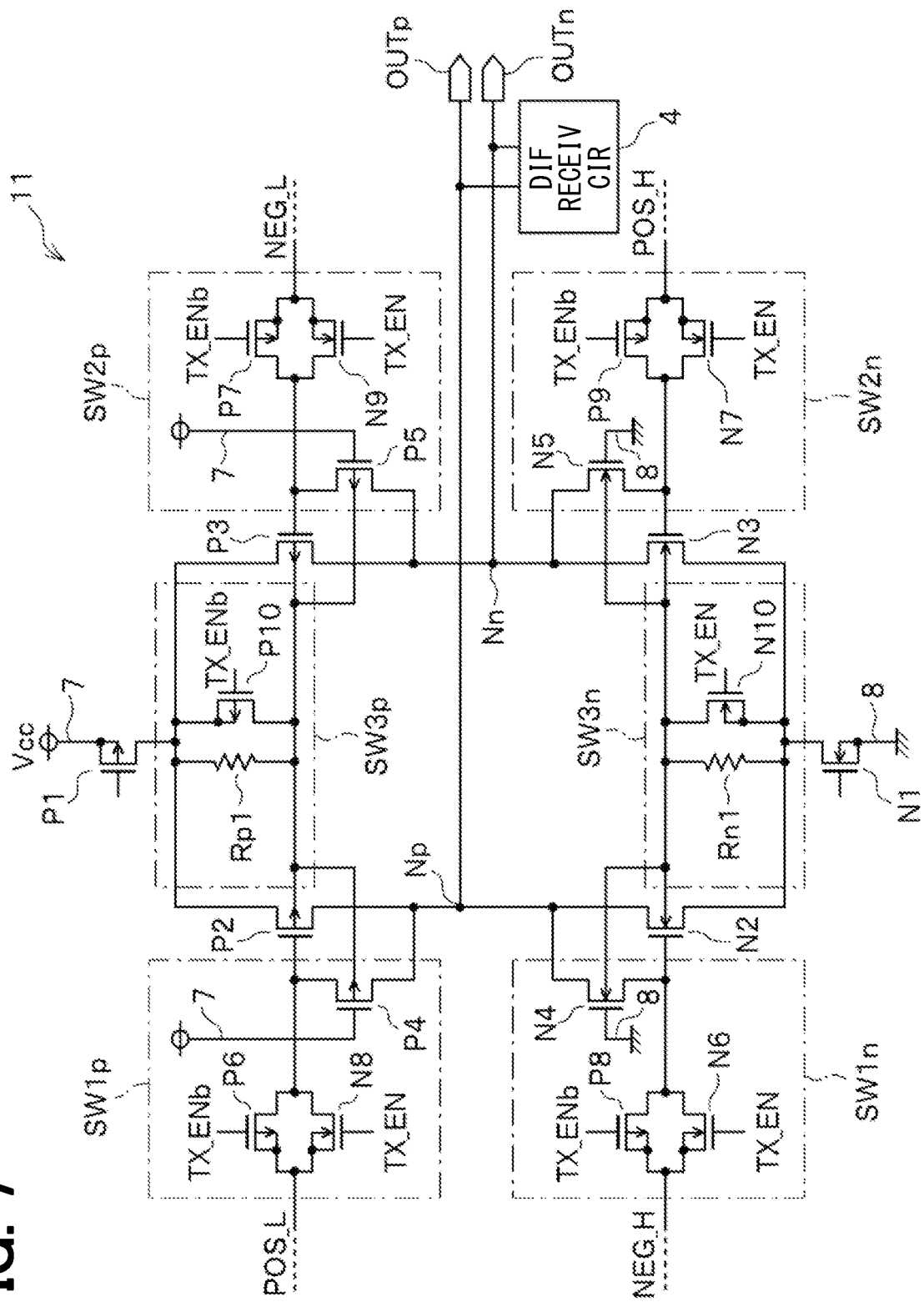
FIG. 7 is a diagram showing a specific configuration example of a differential transmission circuit that embodies the configuration of the switch circuit according to the second embodiment.

As a specific configuration of the switch circuits SW3p, SW3n described above, for example, the configuration shown in FIG. 7 may be adopted. Note that in FIGS. 7 and 9 to 12, which will be described later, the signal generation unit 6 is not shown. The switch circuit SW3p includes a resistor Rp1 and a transistor P10 which is a P-channel MOSFET. The source of the transistor P10 is connected to the source of the transistor P2, and its drain is connected to the back gate of the transistor P2. A signal TX_ENb is given to the gate of the transistor P10. In this case, the switch S9 is configured by the transistor P10.

The switch circuit SW3n includes a resistor Rn1 and a transistor N10 which is an N-channel MOSFET. The source of the transistor N10 is connected to the source of the transistor N2, and its drain is connected to the back gate of the transistor N2. A signal TX_EN is given to the gate of the transistor N10. In this case, the switch S10 is configured by the transistor N10.

According to the above configuration, the transistor P10 functioning as the switch S9 is turned on during the transmission period and turned off during the reception period. Further, according to the above configuration, the transistor N10 functioning as the switch S10 is turned on during the transmission period and turned off during the reception period.

As described above, the differential transmission circuit 11 of the present embodiment includes the switch circuit SW3p and the switch circuit SW3n. The switch circuit SW3p includes a resistor Rp1 connected between the back gate and the source of the transistors P2 and P3, and a switch S9 connected between the terminals of the resistor Rp1. The switch circuit SW3n includes a resistor Rn1 connected between the back gate and the source of the transistors N2 and N3, and a switch S10 connected between the terminals of the resistor Rn1.

In the above configuration, the switches S9 and S10 are turned on during the transmission period. As a result, in the above configuration, the back gate and the source of the transistors P2, P3, N2, and N3 are short-circuited during the transmission period, and the resistors Rp1 and Rn1 do not affect on the switching operation of the transistors P2, P3, N2, and N3 during the transmission operation, so that the transmission operation is performed as usual. Further, in the above configuration, the switches S9 and S10 are turned off during the reception period. As a result, in the above configuration, the back gate bias of the transistors P2 and P3 is performed via the resistor Rp1 during the reception period, and the back gate bias of the transistors N2 and N3 is performed via the resistor Rn1.

In the differential transmission circuit 11, as in the case of the differential transmission circuit 3 of the first embodiment, when the common mode noise having the GND level or less of the circuit or the power supply voltage Vcc or more of the circuit is input from the differential transmission line 2 during the reception period, the transistors P4, P5, N4, N5 are turned on, and then the transistors P2, P3, N2, N3 are turned on. After that, a current flows through the parasitic diode existing between the back gate and the drain of the transistors P2, P3, N2, and N3. In the differential transmission circuit 11 having the above configuration, the resistors Rp1 and Rn1 are arranged additionally in the path through which the current flows, so the current between the back gate and the drain is limited. Thereby, according to the differential transmission circuit 11 of the present embodiment, the clamp level in the reception period can be further expanded.

Figure 8:
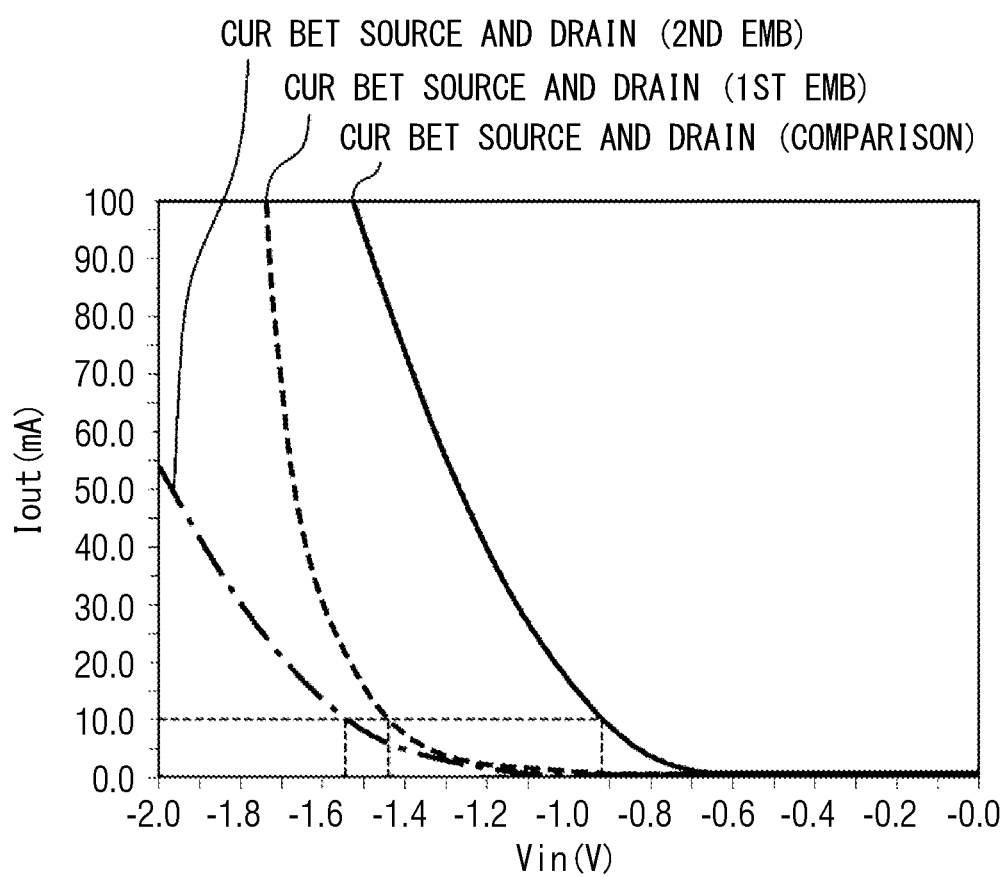
FIG. 8 is a diagram showing an example of the relationship between the terminal voltage and the output current in the reception period according to the second embodiment.

According to the present embodiment, in the configuration of the present embodiment example, when a voltage Vin having the GND level or lower is applied to the terminal OUTp during the reception period, the current flowing through the transistor N2, that is, the output current Iout is shown in FIG. 8. The horizontal axis in FIG. 8 is the voltage Vin of the terminal OUTp, and the vertical axis thereof is the output current Iout. That is, FIG. 8 shows an example of the relationship between the terminal voltage and the output current during the reception period. Further, the output current Iout in FIG. 8 is shown with the direction in which the current flows from the transistor N2 toward the terminal OUTp as positive, similar to FIGS. 4 and 5.

In FIG. 8, the dashed-dotted line represents the source-drain current of the transistor N2 in this embodiment. The solid line and the broken line in FIG. 8 are for comparison, and represent the source-drain current of the transistor N2 in the comparison example and the first embodiment, respectively. The source-drain current of the transistor N2 in the present embodiment starts to flow when the voltage Vin reaches about −0.9V, as in the first embodiment. However, the source-drain current of the transistor N2 in this embodiment becomes about 10.0 mA when the voltage Vin reaches about −1.52 V. That is, according to the present embodiment, when compared with an output current Iout of, for example, 10.0 mA, an expansion of the clamp level of about 0.6 V is realized as compared with the comparison example, and an expansion of about 0.1 V is realized as compared with the first embodiment.

Third Embodiment

Hereinafter, the third embodiment in which the specific configuration of the differential transmission circuit has been changed with respect to the second embodiment will be described with reference to FIG. 9.

Figure 9:
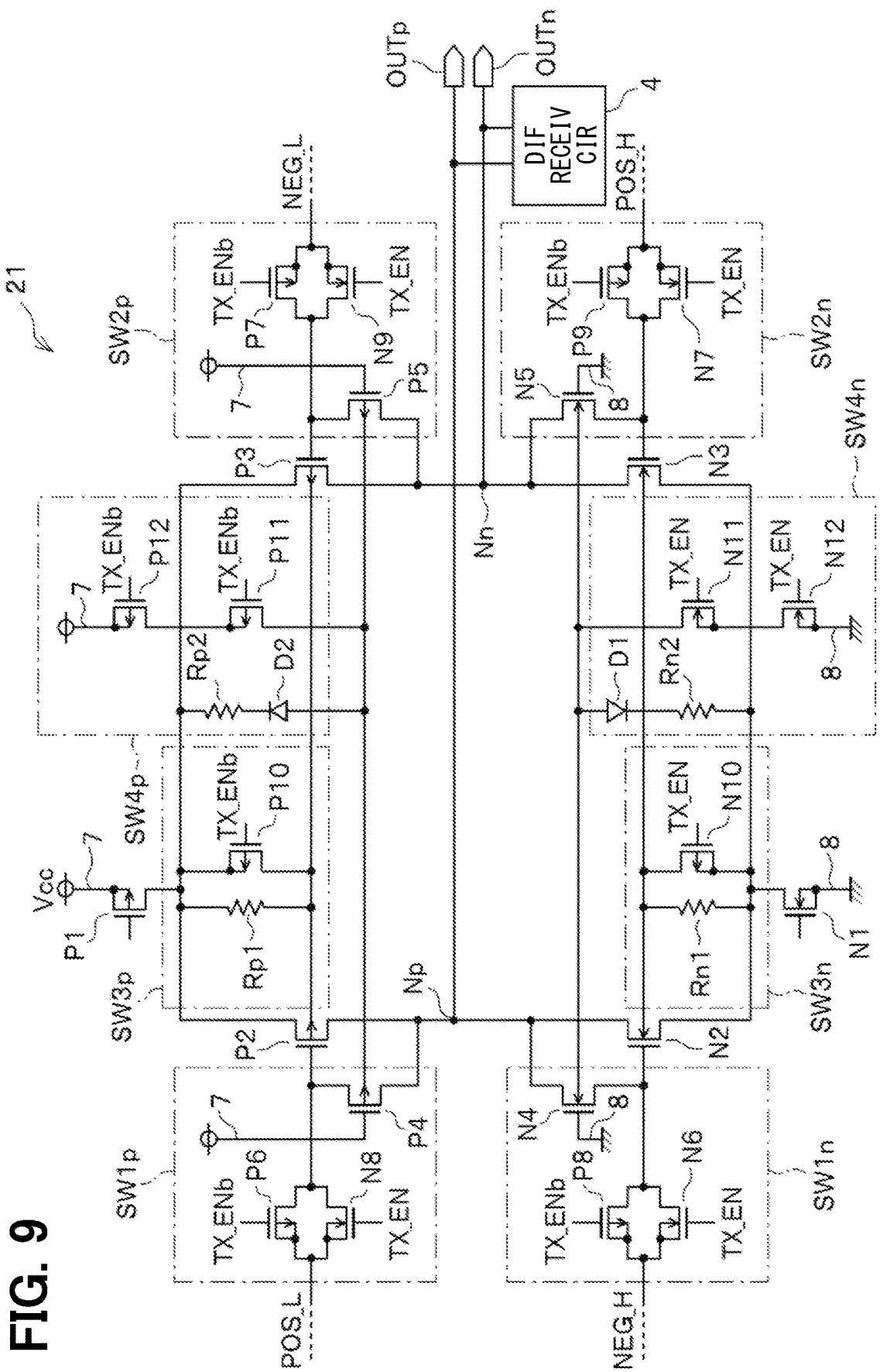
FIG. 9 is a diagram showing a specific configuration example of a differential transmission circuit that embodies the configuration of the switch circuit according to the third embodiment.

As shown in FIG. 9, in the differential transmission circuit 21 of the present embodiment, the switch circuit SW4p and the switch circuit SW4n are added to the differential transmission circuit 11 of the second embodiment shown in FIG. 7, as a different feature.

The switch circuit SW4p includes a diode D2, a resistor Rp2, and transistors P11 and P12 which are P-channel MOSFETs. The anode of the diode D2 is connected to the back gate of the transistors P4 and P5, and its cathode is connected to the source of the transistors P2 and P3 via the resistor Rp2. That is, in this case, the back gate of the transistors P4 and P5 is connected to the source of the transistors P2 and P3 via the diode D2 and the resistor Rp2 which functions as a second resistance for bias.

The drain of the transistor P11 is connected to the back gate of the transistors P4 and P5, and its source is connected to the drain of the transistor P12. The source of the transistor P12 is connected to the power supply line 7. That is, the transistors P11 and P12 are cascade-connected. A signal TX_ENb is given to the gate of the transistors P11 and P12. As a result, the transistors P11 and P12 are turned on during the transmission period and turned off during the reception period.

In the above configuration, the cascade-connected transistors P11 and P12 function as a second switch connected between the back gate of the transistors P4 and P5 and the power supply line 7 which is a node to which the power supply voltage Vcc of the circuit is supplied. Further, in the above configuration, the transistors P11 and P12 functioning as the second switch are turned on during the transmission period and turned off during the reception period.

According to the above configuration, the back gates of the transistors P2 and P3, which function as output transistors during the transmission period, are connected to the source. The back gates of the transistors P2 and P3 may be configured to be connected to a node having the same potential as the source thereof. Further, according to the above configuration, the back gates of the transistors P4 and P5, which function as short-circuit transistors during the transmission period, are connected to the power line 7. As described above, according to the above configuration, the back gates of the transistors P2 and P3 and the transistors P4 and P5 are connected to different places from each other.

The switch circuit SW4n includes a diode D1, a resistor Rn2, and transistors N11 and N12 which are N-channel MOSFETs. The anode of the diode D1 is connected to the back gate of the transistors N4 and N5, and its cathode is connected to the source of the transistors N2 and N3 via the resistor Rn2. That is, in this case, the back gate of the transistors N4 and N5 is connected to the source of the transistors N2 and N3 via the diode D1 and the resistor Rn2 which functions as a second resistance for bias.

The drain of the transistor N11 is connected to the back gate of the transistors N4 and N5, and its source is connected to the drain of the transistor N12. The source of the transistor N12 is connected to the ground line 8. That is, the transistors N11 and N12 are cascade-connected. A signal TX_EN is given to the gate of the transistors N11 and N12. As a result, the transistors N11 and N12 are turned on during the transmission period and turned off during the reception period.

In the above configuration, the cascade-connected transistors N11 and N12 function as the second switch connected between the back gate of the transistors N4 and N5 and the ground line 8 which is the node to which the GND as the reference potential of the circuit is supplied. Further, in the above configuration, the transistors N11 and N12 functioning as the second switch are turned on during the transmission period and turned off during the reception period.

According to the above configuration, the back gates of the transistors N2 and N3, which function as output transistors during the transmission period, are connected to the source. The back gates of the transistors N2 and N3 may be configured to be connected to a node having the same potential as the source thereof. Further, according to the above configuration, the back gates of the transistors N4 and N5, which function as short-circuit transistors during the transmission period, are connected to the ground line 8. As described above, according to the above configuration, the back gates of the transistors N2 and N3 and the transistors N4 and N5 are connected to different places from each other.

In the differential transmission circuit 11 of the second embodiment, the back gates of the transistors P2 and P3 and the transistors P4 and P5 are common, and the back gates of the transistors N2 and N3 and the transistors N4 and N5 are common. However, in such a configuration, the following difficulty may occur. Hereinafter, such a difficulty will be described by taking the transistors P2 to P5 side, that is, the P channel MOSFET side as an example. The same difficulty may occur on the transistors N2 to N5, that is, on the N-channel MOSFET side.

That is, in the configuration of the second embodiment, since the transistor N10 is turned on during the transmission period in which the differential transmission circuit 11 normally operates, the back gate of each of the transistors N2 and N3 and the transistors N4 and N5 are short-circuited to the source of the transistors N2 and N3. Here, when one of the drive signal POS_H and the drive signal NEG_H reaches the H level, the potential of the source of the transistors N2 and N3 rises, and the potential of the back gate of the transistors N2 and N3 also rises accordingly. As a result, a leak current may occur that flows from the back gate of the transistors N2 and N3 to the drain of the transistors N4 and N5.

Therefore, in the differential transmission circuit 21 of the present embodiment, the back gates of the transistors P2, P3 and the transistors P4, P5 are connected to different locations from each other, and the back gates of the transistors N2, N3 and the transistors N4, N5 are connected to different locations from each other. In the above configuration, during the reception period, the back gates of the transistors P4 and P5 are biased by the resistor Rpt through the diode D2, and the back gates of the transistors N4 and N5 are biased by the resistor Rn2 through the diode D1. Further, in the above configuration, during the transmission period, the back gates of the transistors P4 and P5 are biased to the power supply voltage Vcc through the turned-on transistors P11 and P12, and the back gates of the transistors N4 and N5 are biased to the ground GND through the transistors N11 and N12. According to such a configuration, it is possible to suppress the generation of the above-mentioned leak current.

Fourth Embodiment

Hereinafter, the fourth embodiment in which the specific configuration of the differential transmission circuit has been changed with respect to the second embodiment will be described with reference to FIG. 10.

Figure 10:
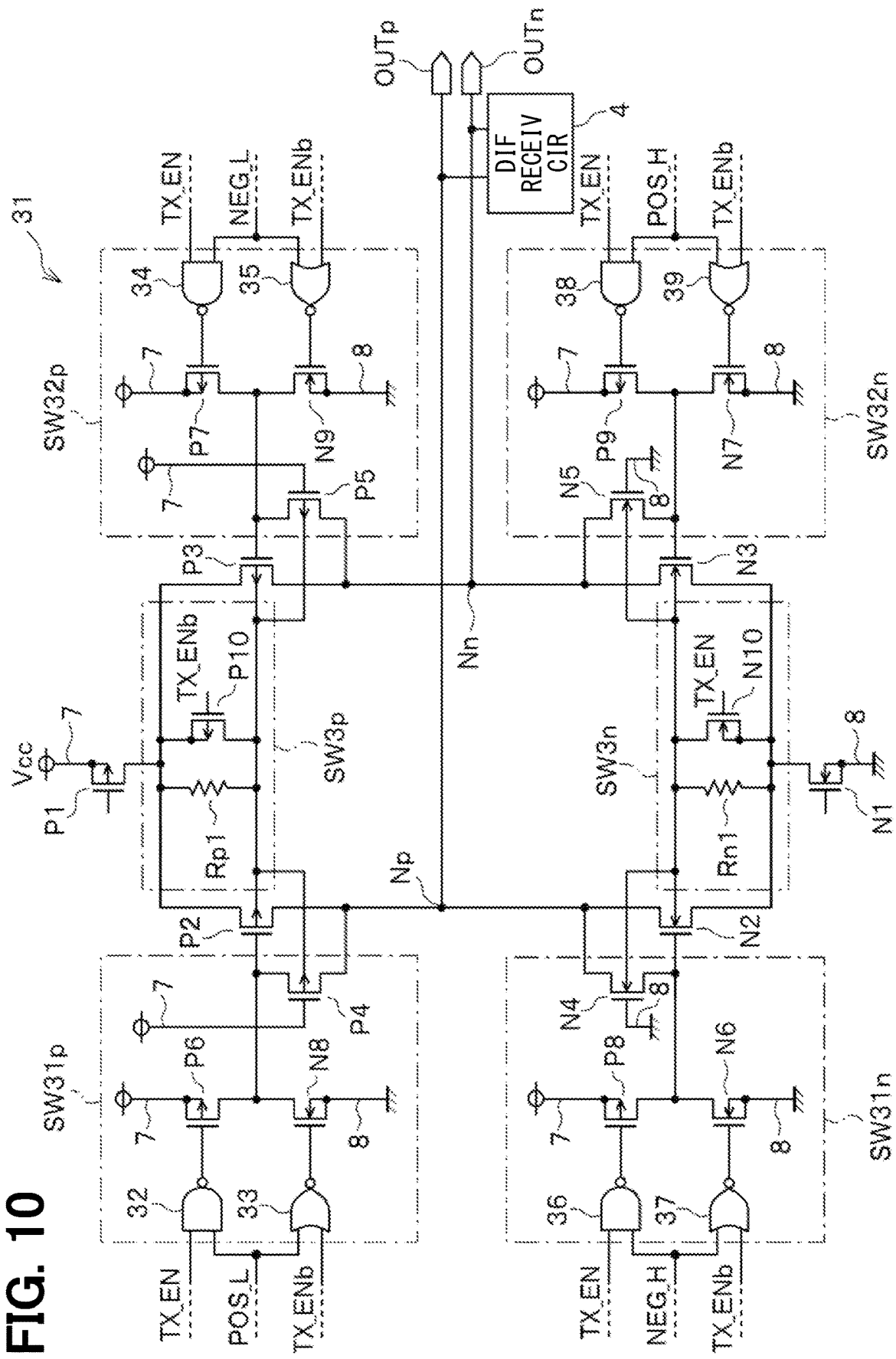
FIG. 10 is a diagram showing a specific configuration example of a differential transmission circuit that embodies the configuration of the switch circuit according to the fourth embodiment.

As shown in FIG. 10, the differential transmission circuit 31 of the present embodiment has the switch circuits SW31p, SW32p, SW31n, SW32n in place of the switch circuits SW1p, SW2p, SW1n, and SW2n with respect to the differential transmission 11 of the second embodiment shown in FIG. 7, as a different feature.

The switch circuit SW31p is different from the switch circuit SW1p in that the NAND circuit 32 and the NOR circuit 33 are added. In this case, the source of the transistor P6 is connected to the power line 7, and the source of the transistor N8 is connected to the ground line 8. The output signal of the NAND circuit 32 is given to the gate of the transistor P6. The output signal of the NOR circuit 33 is given to the gate of the transistor N8.

A signal TX_EN is given to one input terminal of the NAND circuit 32, and a drive signal POS_L is given to the other input terminal. A signal TX_ENb is given to one input terminal of the NOR circuit 33, and a drive signal POS_L is given to the other input terminal. In the above configuration, the transistors P6, N8, the NAND circuit 32 and the NOR circuit 33 input the drive signal POS_L and output a signal corresponding to the drive signal POS_L, and function as a three-state buffer capable of setting the output state to be the high impedance state. In this case, the transistors P6 and N8, the NAND circuit 32, and the NOR circuit 33 that function as such a three-state buffer, constitute a switch S1 that functions as a cutoff unit.

The switch circuit SW32p is different from the switch circuit SW2p in that the NAND circuit 34 and the NOR circuit 35 are added. In this case, the source of the transistor P7 is connected to the power line 7, and the source of the transistor N9 is connected to the ground line 8. The output signal of the NAND circuit 34 is given to the gate of the transistor P7. The output signal of the NOR circuit 35 is given to the gate of the transistor N9.

A signal TX_EN is given to one input terminal of the NAND circuit 34, and a drive signal NEG_L is given to the other input terminal. A signal TX_ENb is given to one input terminal of the NOR circuit 35, and a drive signal NEG_L is given to the other input terminal. In the above configuration, the transistors P7, N9, the NAND circuit 34 and the NOR circuit 35 input the drive signal NEG_L and output a signal corresponding to the drive signal NEG_L, and function as a three-state buffer capable of setting the output state to be the high impedance state. In this case, the transistors P7 and N9, the NAND circuit 34, and the NOR circuit 35 that function as such a three-state buffer, constitute a switch S3 that functions as a cutoff unit.

The switch circuit SW31n is different from the switch circuit SW1n in that the NAND circuit 36 and the NOR circuit 37 are added. In this case, the source of the transistor P8 is connected to the power line 7, and the source of the transistor N6 is connected to the ground line 8. The output signal of the NAND circuit 36 is given to the gate of the transistor P8. The output signal of the NOR circuit 37 is given to the gate of the transistor N6.

A signal TX_EN is given to one input terminal of the NAND circuit 36, and a drive signal NEG_H is given to the other input terminal. A signal TX_ENb is given to one input terminal of the NOR circuit 37, and a drive signal NEG_H is given to the other input terminal. In the above configuration, the transistors P8, N6, the NAND circuit 36 and the NOR circuit 37 input the drive signal NEG_H and output a signal corresponding to the drive signal NEG_H, and function as a three-state buffer capable of setting the output state to be the high impedance state. In this case, the transistors P8 and N6, the NAND circuit 36, and the NOR circuit 37 that function as such a three-state buffer, constitute a switch S5 that functions as a cutoff unit.

The switch circuit SW32n is different from the switch circuit SW2n in that the NAND circuit 38 and the NOR circuit 39 are added. In this case, the source of the transistor P9 is connected to the power line 7, and the source of the transistor N7 is connected to the ground line 8. The output signal of the NAND circuit 38 is given to the gate of the transistor P9. The output signal of the NOR circuit 39 is given to the gate of the transistor N7.

A signal TX_EN is given to one input terminal of the NAND circuit 38, and a drive signal POS_H is given to the other input terminal. A signal TX_ENb is given to one input terminal of the NOR circuit 39, and a drive signal POS_H is given to the other input terminal. In the above configuration, the transistors P9, N7, the NAND circuit 38 and the NOR circuit 39 input the drive signal POS_H and output a signal corresponding to the drive signal POS_H, and function as a three-state buffer capable of setting the output state to be the high impedance state. In this case, the transistors P9 and N7, the NAND circuit 38, and the NOR circuit 39 that function as such a three-state buffer, constitute a switch S7 that functions as a cutoff unit.

Even with the differential transmission circuit 31 of the present embodiment described above, the gates of the transistors P2, P3, N2, and N3 have high impedance during the reception period. Therefore, this embodiment also has the same effect as that of each of the above embodiments, that is, the effect that the clamp level in the reception period can be expanded without narrowing the dynamic range of the output.

Fifth Embodiment

Hereinafter, the fifth embodiment in which the specific configuration of the differential transmission circuit has been changed with respect to the second embodiment will be described with reference to FIG. 11.

Figure 11:
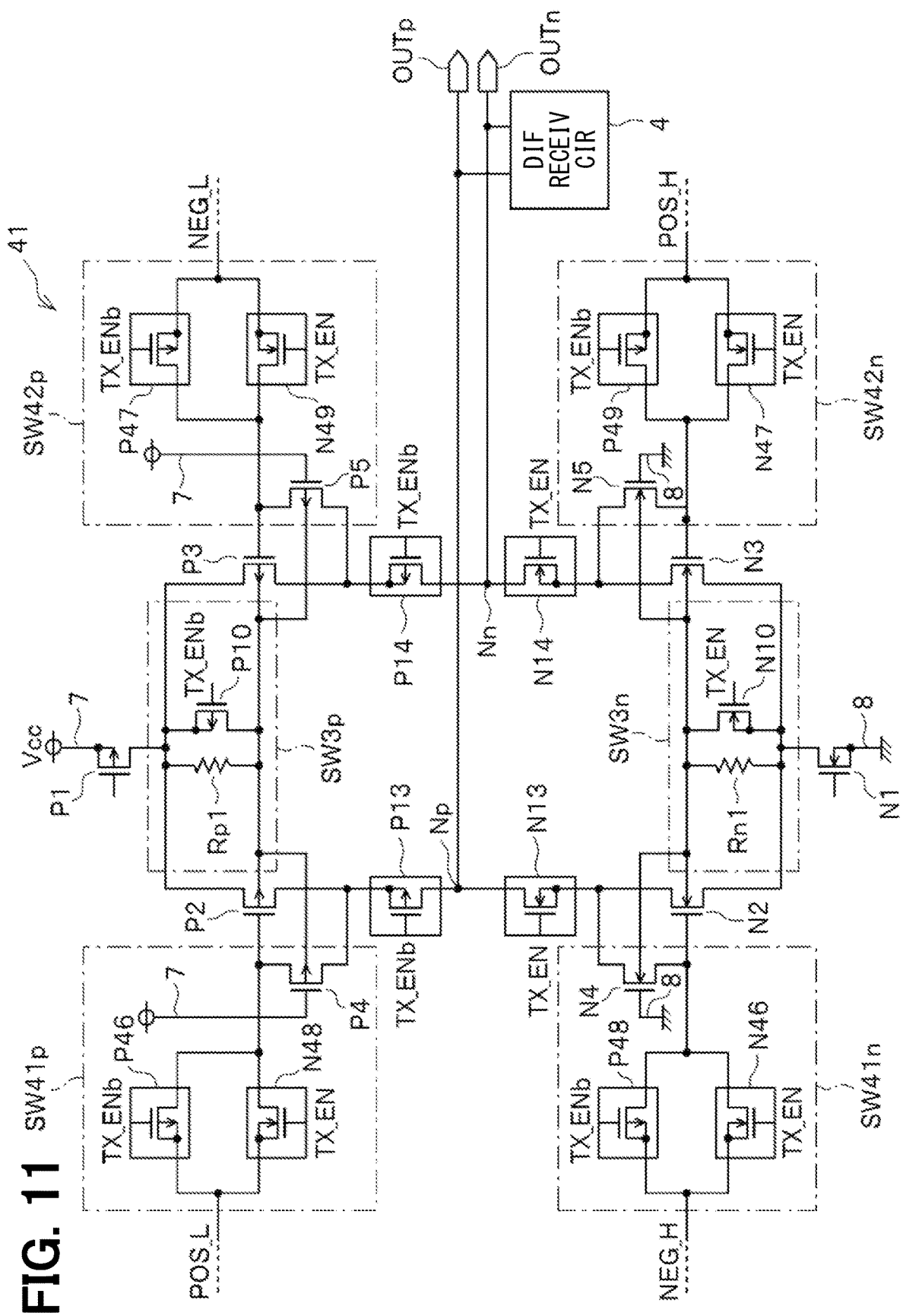
FIG. 11 is a diagram showing a specific configuration example of a differential transmission circuit that embodies the configuration of the switch circuit according to the fifth embodiment.

As shown in FIG. 11, the differential transmission circuit 41 of the present embodiment has the transistors P13, P14 as P channel MOSFETs and the transistors N13 and N14 as N channel MOSFETs are added, and the switch circuits SW41p, SW42p, SW41n, and SW42n in place of the switch circuits SW1p, SW2p, SW1n, and SW2n are arranged, compared with the differential transmission circuit 11 of the second embodiment shown in FIG. 7,i as a different feature.

The source of the transistor P13 is connected to the drain of the transistor P2, and the drain is connected to the node Np. A signal TX_ENb is given to the gate of the transistor P13. The source of the transistor P14 is connected to the drain of the transistor P3, and the drain is connected to the node Nn. A signal TX_ENb is given to the gate of the transistor P14.

The source of the transistor N13 is connected to the drain of the transistor N2, and the drain is connected to the node Np. A signal TX_EN is given to the gate of the transistor N13. The source of the transistor N14 is connected to the drain of the transistor N3, and the drain is connected to the node Nn. A signal TX_EN is given to the gate of the transistor N14.

As described above, in the above configuration, the transistors P13, P14, N13, and N14 are an example of the switching element disposed and interposed between the drain of the transistors P2, P3, N2, and N3, which function as output transistors, and the differential transmission line 2 in series. In this case, as the transistors P13, P14, N13, and N14, a high withstand voltage element having a withstand voltage higher than the power supply voltage Vcc of the circuit is used.

The switch circuit SW41p is different from the switch circuit SW1p in that the transistors P46 and N48 are provided in place of the transistors P6 and N8. The transistor P46 which is a P-channel MOSFET and the transistor N48 which is an N-channel MOSFET are connected in the same manner as the transistors P6 and N8, and are configured to be analog switches so as to intervene in series with the supply path of the drive signal POS_L. In this case, the switch S1 is configured by an analog switch including transistors P46 and N48. As the transistors P46 and N48, a high withstand voltage element having a withstand voltage higher than the power supply voltage Vcc of the circuit is used.

The switch circuit SW42p is different from the switch circuit SW2p in that the transistors P47 and N49 are provided in place of the transistors P7 and N9. The transistor P47 which is a P-channel MOSFET and the transistor N49 which is an N-channel MOSFET are connected in the same manner as the transistors P7 and N9, and are configured to be analog switches so as to intervene in series with the supply path of the drive signal NEG_L. In this case, the switch S3 is configured by an analog switch including transistors P47 and N49. As the transistors P47 and N49, a high withstand voltage element having a withstand voltage higher than the power supply voltage Vcc of the circuit is used.

The switch circuit SW41n, is different from the switch circuit SW1n in that the transistors P48 and N46 are provided in place of the transistors P8 and N6. The transistor P48 which is a P-channel MOSFET and the transistor N46 which is an N-channel MOSFET are connected in the same manner as the transistors P8 and N6, and are configured to be analog switches so as to intervene in series with the supply path of the drive signal NEG_H. In this case, the switch S5 is configured by an analog switch including transistors P48 and N46. As the transistors P48 and N46, a high withstand voltage element having a withstand voltage higher than the power supply voltage Vcc of the circuit is used.

The switch circuit SW42n is different from the switch circuit SW2n in that the transistors P49 and N47 are provided in place of the transistors P9 and N7. The transistor P49 which is a P-channel MOSFET and the transistor N47 which is an N-channel MOSFET are connected in the same manner as the transistors P9 and N7, and are configured to be analog switches so as to intervene in series with the supply path of the drive signal POS_H. In this case, the switch S7 is configured by an analog switch including transistors P49 and N47. As the transistors P49 and N47, a high withstand voltage element having a withstand voltage higher than the power supply voltage Vcc of the circuit is used.

Therefore, according to the present embodiment, the same effects as in the second embodiment are attained. Further, according to the differential transmission circuit 41 of the present embodiment, since the transistors P13, P14, N13, and N14 as a high withstand voltage element are interposed between the drains of the transistors P2, P3, N2, N3 functioning as output transistors and the differential transmission line 2 in series, even if the withstand voltage between the gate and the drain of the output transistor is insufficient, it is possible to avoid the occurrence of difficulty caused by the insufficient withstand voltage.

Further, in the differential transmission circuit 41, since a high withstand voltage element is used as each transistor constituting the switches S1, S3, S5, and S7, when the potential of the differential transmission line 2 becomes the GND level or less, or even when the potential of the differential transmission path 2 becomes equal to or higher than the power supply voltage Vcc, it is possible to avoid the occurrence of a difficulty caused by insufficient withstand voltage between the gate and the drain of each transistor. In this case, it is not necessary to use a high withstand voltage element for the transistors P6, P7, N6, and N7, but in order to have the same characteristics as an analog switch, the same high withstand voltage elements as the transistors N8, N9, P8, and P9 are used.

Sixth Embodiment

Hereinafter, the sixth embodiment in which the specific configuration of the differential transmission circuit has been changed with respect to the fourth embodiment will be described with reference to FIG. 12.

Figure 12:
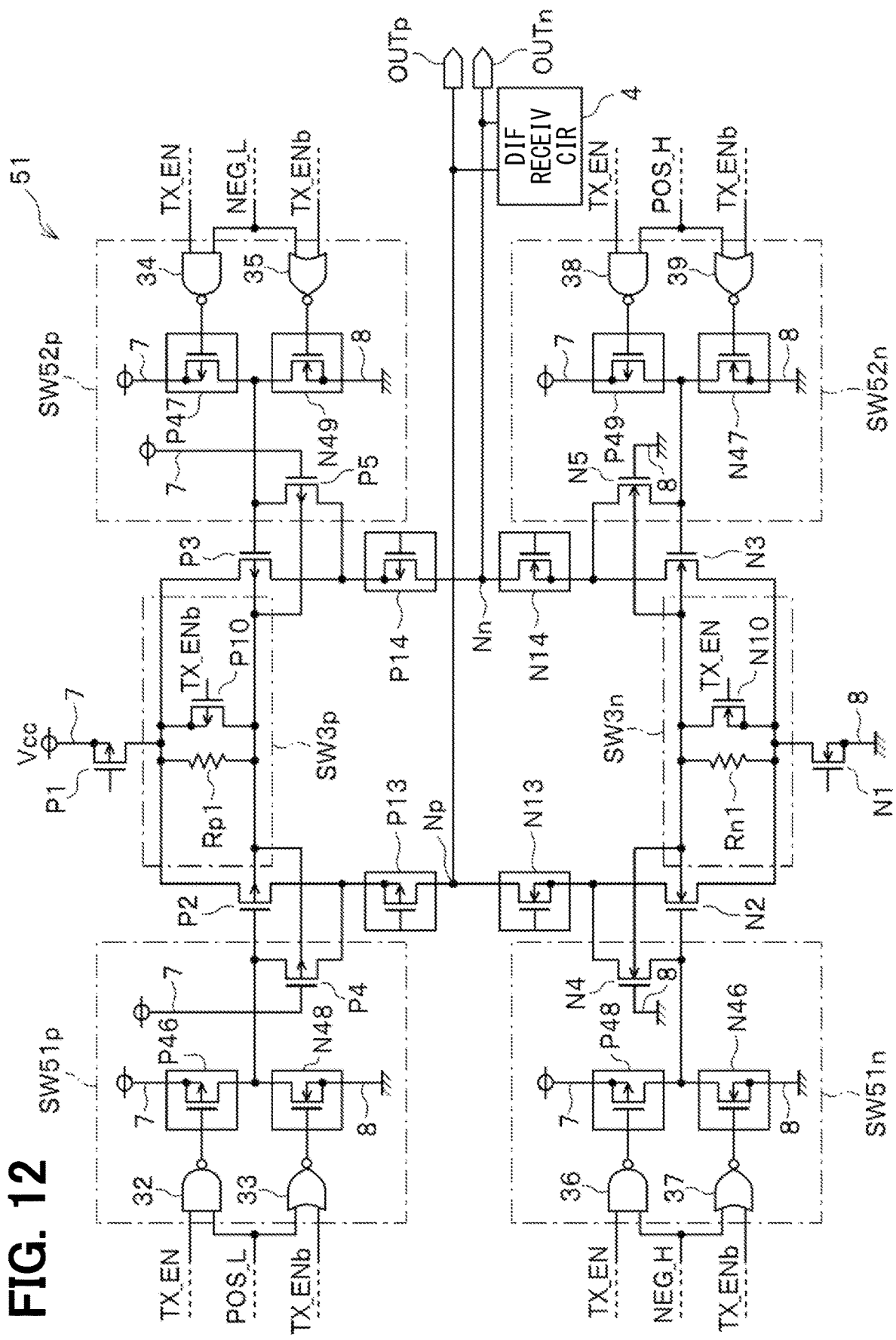
FIG. 12 is a diagram showing a specific configuration example of a differential transmission circuit that embodies the configuration of the switch circuit according to the sixth embodiment.

As shown in FIG. 12, in the differential transmission circuit 51 of the present embodiment, the transistors P13, P14, N13, and N14 are added to the differential transmission circuit 31 of the fourth embodiment shown in FIG. 10, and further the switch circuits SW51p, SW52p, SW51n, and SW52n are provided in place of the switch circuits SW31p, SW32p, SW31n, and SW32n. The transistors P13, P14, N13, and N14 are the same as those described in the fifth embodiment.

The switch circuit SW51p is different from the switch circuit SW31p in that the transistors P46 and N48 are provided in place of the transistors P6 and N8. The transistors P46, and N48 are the same as those described in the fifth embodiment. The switch circuit SW52p is different from the switch circuit SW32p in that the transistors P47 and N49 are provided in place of the transistors P7 and N9. The transistors P47, and N49 are the same as those described in the fifth embodiment.

The switch circuit SW51n is different from the switch circuit SW31n in that the transistors P48 and N46 are provided in place of the transistors P8 and N6. The transistors P48, and N46 are the same as those described in the fifth embodiment. The switch circuit SW52n is different from the switch circuit SW32n in that the transistors P49 and N47 are provided in place of the transistors P9 and N7. The transistors P49, and N47 are the same as those described in the fifth embodiment.

Therefore, according to the present embodiment, the same effects as in the fourth embodiment are attained. Further, according to the differential transmission circuit 51 of the present embodiment, since the transistors P13, P14, N13, and N14 as a high withstand voltage element are interposed between the drains of the transistors P2, P3, N2, N3 functioning as output transistors and the differential transmission line 2 in series, even if the withstand voltage between the gate and the drain of the output transistor is insufficient, it is possible to avoid the occurrence of difficulty caused by the insufficient withstand voltage.

Further, in the differential transmission circuit 51, since a high withstand voltage element is used as each transistor constituting the switches S1, S3, S5, and S7, when the potential of the differential transmission line 2 becomes the GND level or less, or even when the potential of the differential transmission path 2 becomes equal to or higher than the power supply voltage Vcc, it is possible to avoid the occurrence of a difficulty caused by insufficient withstand voltage between the gate and the drain of each transistor. In this case, it is not necessary to use a high withstand voltage element for the transistors P6, P7, N6, and N7, but in order to have the same characteristics as an inverter circuit, the same high withstand voltage elements as the transistors N8, N9, P8, and P9 are used.

Other Embodiments

The present disclosure is not limited to the embodiments that have been described above and illustrated in the drawings, but can freely be modified, combined, or expanded without departing from the gist of the present disclosure.

The numerical values and the like shown in the embodiments described above are examples, and are not limited to those examples.

The present embodiments are not limited to the differential transmission circuit 3 used in the communication device 1 that can be applied to in-vehicle applications, industrial equipment, and the like, but may be used in all communication devices that perform bidirectional communication via a differential transmission line.

Although the present disclosure has been described in accordance with the embodiments, it is understood that the present disclosure is not limited to the above embodiments or structures. The present disclosure incorporates various modifications and variations within the scope of equivalents. Furthermore, various combinations and formations, and other combinations and formations including one or more than one or less than one element may be included in the scope and the spirit of the present disclosure.

What is claimed is:

1. A differential transmission circuit for a communication device that performs bidirectional communication via a differential transmission line, the differential transmission circuit comprising:
  a plurality of output transistors, each of which is a MOSFET that is turned on and off according to a drive signal during a transmission period in which a transmission operation is performed by the communication device;
  a signal generation unit that generates and outputs the drive signal;
  a plurality of short-circuit transistors, each of which is a MOSFET connected between a gate and a drain of one of the plurality of output transistors; and
  a cut off unit that cuts off a supply path of the drive signal between the signal generation unit and the gate of the one of the plurality of output transistors, wherein:
  the cut off unit cuts off the supply path of the drive signal during a reception period in which a reception operation is performed by the communication device.

2. The differential transmission circuit according to claim 1, wherein:
the cut off unit includes an analog switch provided so as to intervene in series with the supply path of the drive signal.

3. The differential transmission circuit according to claim 1, wherein:
the cut off unit includes a three state buffer for inputting the drive signal, outputting a signal corresponding to the drive signal, and setting an output state to be a high impedance state.

4. The differential transmission circuit according to claim 1, further comprising:
a first resistor connected between a back gate and a source of the one of the plurality of output transistors; and
a first switch connected between terminals of the first resistor, wherein:
the first switch is turned on during the transmission period and turned off during the reception period.

5. The differential transmission circuit according to claim 4, wherein:
a back gate of the one of the plurality of output transistors and a back gate of one of the short-circuit transistors are connected to different locations from each other.

6. The differential transmission circuit according to claim 5, wherein:
the back gate of the one of the plurality of output transistors is connected to a source thereof or a node with a potential equal to the source; and
the back gate of the one of the plurality of short-circuit transistors is connected to the source of the one of the plurality of output transistors via a diode and a second resistor for bias;
the differential transmission circuit further comprising:
a second switch connected between the back gate of the one of the plurality of short-circuit transistors and a node to which a power supply voltage of the circuit or a reference potential of the circuit is supplied, wherein:
the second switch is turned on during the transmission period and turned off during the reception period.

7. The differential transmission circuit according to claim 1, further comprising:
a switching element provided so as to be interposed between a drain of the one of the plurality of output transistors and the differential transmission line in series, wherein:
the switching element is a high withstand voltage element having a withstand voltage higher than a power supply voltage of the circuit; and
the cut off unit includes a high withstand voltage element having a withstand voltage higher than the power supply voltage of the circuit.

\* \* \* \* \*